US008134130B2

(12) United States Patent
Herrero et al.

(10) Patent No.: US 8,134,130 B2

(45) Date of Patent: Mar. 13, 2012

(54) ION SOURCE WITH CORNER CATHODE

(75) Inventors: Federico A. Herrero, Glenn Dale, MD (US); Patrick A. Roman, Washington, DC (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 88 days.

(21) Appl. No.: 12/839,207

(22) Filed: Jul. 19, 2010

(65) Prior Publication Data

US 2012/0012746 A1 Jan. 19, 2012

(51) Int. Cl.
*H01J 37/08* (2006.01)
*H01J 49/10* (2006.01)

(52) U.S. Cl. ................ 250/427; 250/423 R; 250/396 R; 315/111.81

(58) Field of Classification Search .................. 250/427, 250/423 R, 396 R; 315/111.81
See application file for complete search history.

(56) References Cited

U.S. PATENT DOCUMENTS 7,247,863 B2 * 7/2007 Berrian .......................... 250/427
7,759,655 B2 * 7/2010 McCauley .................... 250/427

* cited by examiner

*Primary Examiner* — Nikita Wells

(57) ABSTRACT

An ion source may include first, second, and third electrodes. The first electrode may be a repeller having a V-shaped groove. The second electrode may be an electron emitter filament disposed adjacent the base of the V-shaped groove. The third electrode may be an anode that defines an enclosed volume with an aperture formed therein adjacent the electron emitter filament. A potential of the first electrode may be less than a potential of the second electrode, and the potential of the second electrode may be less than a potential of the third electrode. A fourth electrode that is disposed between the electron emitter filament and the anode may be used to produce a more collimated electron beam.

20 Claims, 6 Drawing Sheets

ION SOURCE WITH CORNER CATHODE

ORIGIN OF INVENTION

The invention described herein was made in the performance of work under a NASA contract and by an employee of the United States Government and is subject to Public Law 96-517 (35 U.S.C. 5200 et seq.). The contractor has not elected to retain title to the invention.

FIELD OF THE INVENTION

The invention relates to methods and apparatus for producing collimated electron beams.

BACKGROUND

Mass spectrometers may benefit from collimated electron beams that allow for extended ion source geometries and optimal ionization efficiency per microampere of electron beam. Small electron guns that provide collimated electron beams with output currents ranging from picoamps to milliamps may be required to rapidly calibrate electron spectrometers. In such applications, the electron guns must be easily arranged in front of electron spectrometer apertures, and it may be helpful to have only a small number of electrodes to connect.

Ion sources may be used in mass spectrometers and in many other applications, including calibration of electron spectrometers for space plasma physics. The miniaturization of spectrometers may require a corresponding miniaturization in ion sources and ion sources' electron guns. Because of the increasing number of spectrometer suites in space plasma physics, a single instrument suite may include six or more electron spectrometers. Often, all of these spectrometers must be carefully calibrated to achieve the scientific goals. So, in addition to mass spectrometer applications, electron guns may be used to inject electron beams into the spectrometer apertures at different electron energies and angles of incidence. Smaller electron guns may be moved more easily than larger electron guns. Furthermore, if only a small number of electrodes are required to operate the electron gun, the risk of voltage breakdown of the electron gun may be reduced, for example, when calibrating for electrons exceeding several KeVs of kinetic energy.

SUMMARY

It is an object of the invention to provide an ion source that may be smaller, may have fewer electrodes, and may require less power than known ion sources.

In one aspect, an ion source may include three electrodes. A first electrode may be a repeller having a V-shaped groove defined by a pair of planar surfaces symmetrically disposed at an angle to each other. The V-shaped groove may include a base defined by a line of intersection of the pair of planar surfaces. A second electrode may be an electron emitter filament disposed adjacent the base of the V-shaped groove midway between the pair of planar surfaces and in the angle between the pair of planar surfaces. The electron emitter filament may have a longitudinal axis that is substantially parallel to the base of the V-shaped groove.

A third electrode may be an anode. The anode may define an enclosed volume having an aperture formed therein adjacent the electron emitter filament. A center of the aperture may lie in a plane that contains the base of the V-shaped groove and the longitudinal axis of the electron emitter filament. A potential of the first electrode may be less than a potential of the second electrode and the potential of the second electrode may be less than a potential of the third electrode.

In another aspect, the ion source may include a fourth electrode. The fourth electrode may be disposed between the electron emitter filament and the anode. The fourth electrode may include an aperture formed therein. A center of the aperture may lie in the plane that contains the base of the V-shaped groove and the longitudinal axis of the electron emitter filament. A potential of the fourth electrode may be greater than the potential of the second electrode and less than the potential of the third electrode.

In a further aspect, the ion source may be part of a spectrometer.

The invention will be better understood, and further objects, features, and advantages thereof will become more apparent from the following description of the preferred embodiments, taken in conjunction with the accompanying drawings.

BRIEF DESCRIPTION OF THE DRAWINGS

In the drawings, which are not necessarily to scale, like or corresponding parts are denoted by like or corresponding reference numerals.

DETAILED DESCRIPTION

An ion source having a "corner" cathode geometry may require only three or four electrodes for operation. The ion source with the corner cathode geometry may be housed in a volume less than about 2×2×2 $cm^3$. Thus, the ion source may easily be biased to very high voltages to provide a broad range of energies, from a few eV to tens of KeVs.

The ion source may produce a collimated electron beam using no more than three electrodes. One of the electrodes may be a filament, one electrode may be a repeller, and one electrode may be an anode. The anode electrode may ultimately determine the energy of the electrons. A greater degree of collimation may be achieved with an additional, fourth electrode.

The ion source may be used in spectrometers, such as, for example, charged particle spectrometers. The ion source may provide a solution for enhancing mass spectrometer sensitivity. The ion source may be used in a commercial electron or ion spectrometer that requires an electron beam for calibration or ion production by electron impact.

Figure 1:
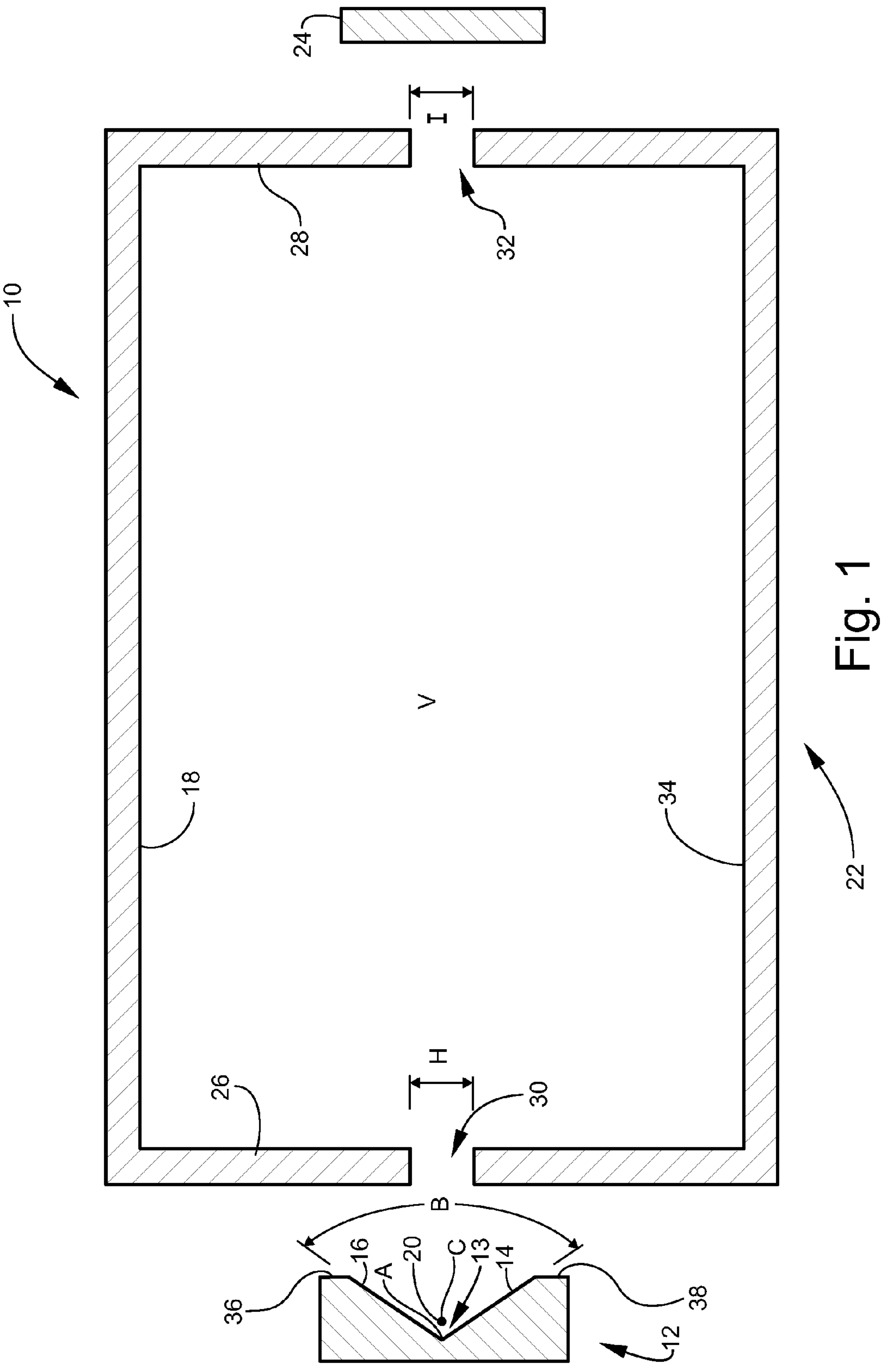
FIG. 1 is a schematic drawing of an embodiment of a three-electrode ion source.

FIG. 1 is a schematic drawing of an embodiment of a three-electrode ion source 10. Ion source 10 may include a first electrode in the form of a repeller electrode 12. The repeller electrode 12 may include a V-shaped groove 13. The V-shaped groove 13 may be defined by a pair of planar surfaces 14, 16. Planar surfaces 14, 16 may be symmetrically disposed at an angle B with respect to each other. The V-shaped groove 13 may include a base A defined by a line of intersection of the pair of planar surfaces 14, 16.

In FIG. 1, base A appears as a point or dot because base A is orthogonal to the plane of FIG. 1. The angle B between the pair of planar surfaces 14, 16 may be in a range of about 80 to about 120 degrees, or more particularly, in a range of about 90 degrees to about 110 degrees.

A second electrode comprising an electron emitter filament 20 may be disposed adjacent the base A of the V-shaped groove 13. Filament 20 may be located midway between the pair of planar surfaces 14, 16 and in the angle B between the pair of planar surfaces 14, 16. The electron emitter filament 20 may have a longitudinal axis C that is parallel to the base A of the V-shaped groove 13. In FIG. 1, filament 20 appears as a point or dot because it is orthogonal to the plane of FIG. 1.

A third electrode comprising an anode 22 may be disposed adjacent the filament 20 on an opposite side of the filament 20 from the repeller 12. Anode 22 may define an enclosed volume V with an aperture 30 formed therein adjacent the electron emitter filament 20. A center of the aperture 30 may lie in a plane that contains the base A of the V-shaped groove 13 and the longitudinal axis C of the electron emitter filament 20.

The electrical potential of the first electrode (repeller) 12 may be less than the potential of the second electrode (emitter) 20. The potential of the second electrode 20 may be less than the potential of the third electrode (anode) 22. By way of example, the repeller 12 may be at about −105.5 volts, the filament 20 at about −100 volts, and the anode 22 at about 0 volts.

The shape of anode 22 may be regular or irregular. Regular shapes for anode 22 may include, for example, cylinders and rectangular prisms. In FIG. 1, the top and bottom sides 18, 34 of anode 22 are shown sectioned, and may represent surfaces of a cylinder or rectangular prism, for example. The front and/or rear ends 26, 28 of anode 22 may be, for example, planar surfaces. The front and/or rear ends 26, 28 of anode 22 may be normal to the plane that contains the base A of the V-shaped groove 13 and the longitudinal axis C of the electron emitter filament 20.

Anode 22 may include a second aperture 32 located further from the electron emitter filament 20 than the aperture 30. The second aperture 32 may have a center that lies in the plane that contains the base A of the V-shaped groove 13 and the longitudinal axis C of the electron emitter filament 20. The electron beam generated by filament 20 may have the form of a "ribbon." The beam may pass through aperture 30 and aperture 32. A collector 24 may be disposed adjacent aperture 32, outside of enclosed volume V, for measuring the energy of the electron beam.

Figure 1A:
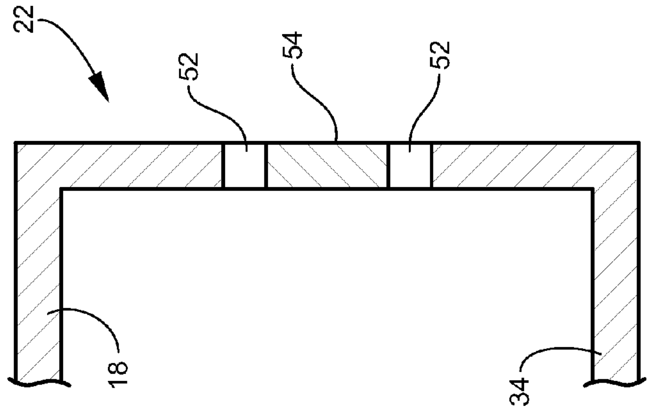
FIG. 1A shows an alternative energy measuring component of the anode shown in FIG. 1.

As an alternative to an exterior collector 24, FIG. 1A shows the anode 22 with an energy measurement portion 54 that may be electrically insulated from a remainder of the anode 22. The energy measurement portion 54 may be located further from the electron emitter filament 20 than the aperture 30. The energy measurement portion 54 may have a center that lies in the plane that contains the base A of the V-shaped groove 13 and the longitudinal axis C of the electron emitter filament 20. Energy measurement portion 54 may be connected to an electrical meter (not shown) to measure the energy of the incident electron beam.

Repeller 12 may optionally include respective planar surfaces 36, 38 that may extend from each tip of the V-shaped groove 13. The respective planar surfaces 36, 38 may lie in a plane that is normal to the plane that contains the base A of the V-shaped groove 13 and the longitudinal axis C of the electron emitter filament 20.

Apertures 30, 32 may represent the entrance and exit to the ionization region in a mass spectrometer ion source. The ionization region may be a field-free region. The distance between the base A of the V-shaped groove 13 and the filament 20 may be, for example, about 0.030 inches. The distance between surfaces 36, 38 and front end 26 of anode 22 may be about 0.030 inches. The widths H, I of apertures 30, 32 may be, for example, about 0.050 inches.

Figure 2:
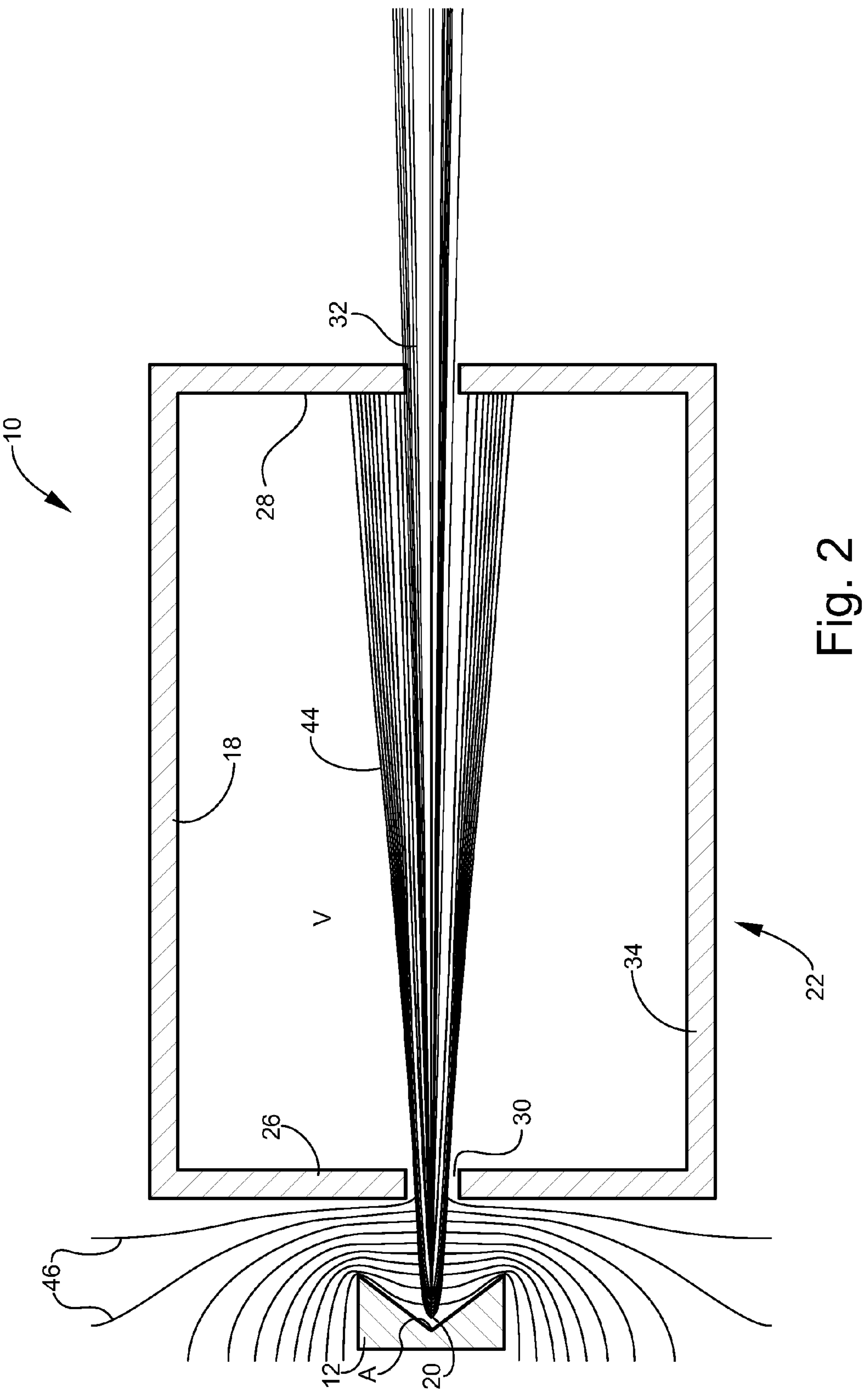
FIG. 2 is a schematic drawing of the ion source of FIG. 1, showing a simulated electron beam and lines of equal potential.

FIG. 2 is a schematic drawing of the electron gun 10 of FIG. 1, showing a simulated electron beam 44 and lines of equal potential 46. In FIG. 2, the optional planar surfaces 36, 38 are not shown.

Figure 3:
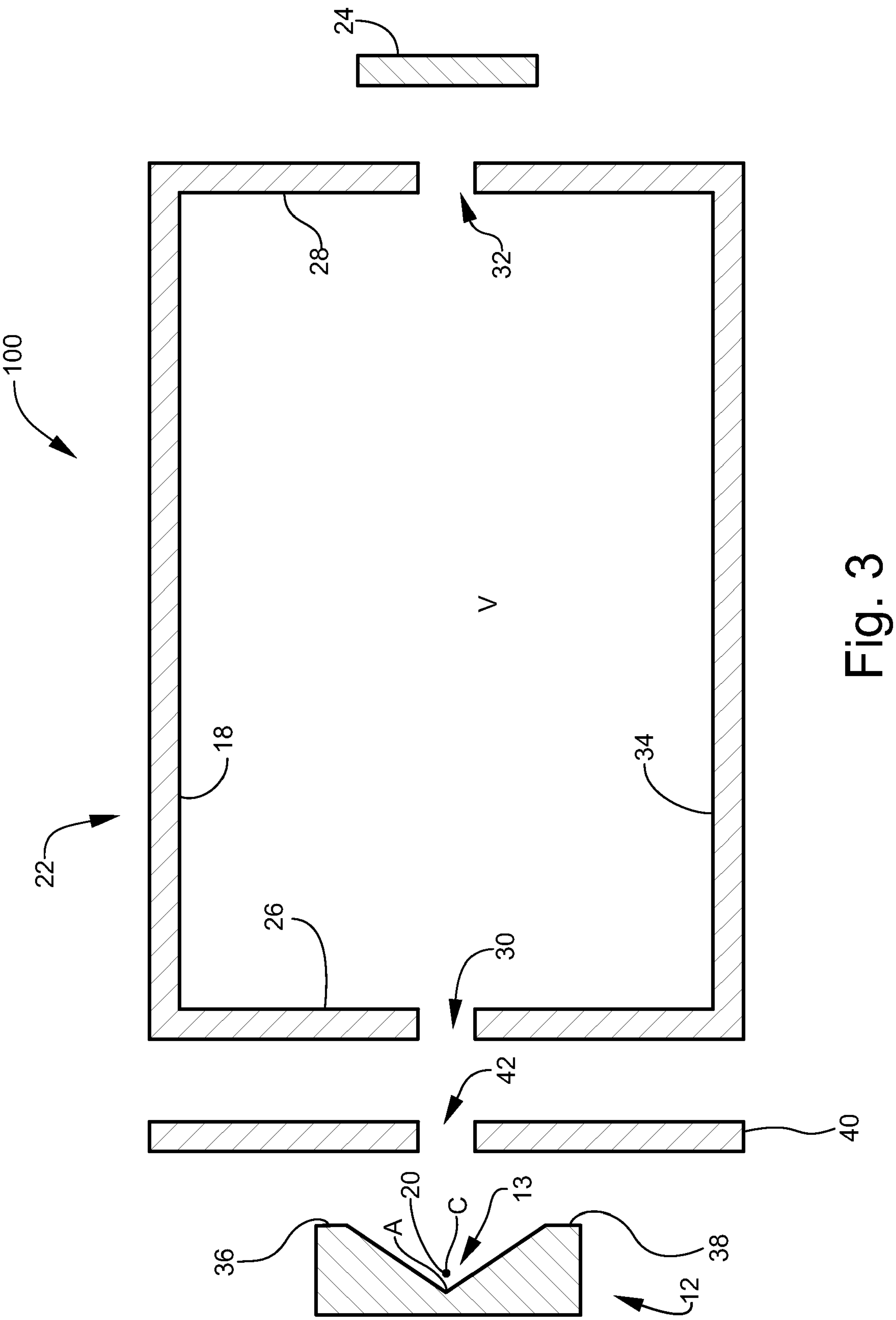
FIG. 3 is a schematic drawing of an embodiment of a four-electrode ion source.

FIG. 3 is a schematic drawing of an embodiment of a four-electrode ion source 100. Ion source 100 may include a repeller electrode 12, a filament electrode 20, and an anode 22. In addition, ion source 100 may include a fourth electrode 40. Electrode 40 may be disposed between the filament 20 and anode 22. Electrode 40 may be planar. Electrode 40 may be normal to the plane that contains the base A of the V-shaped groove 13 and the longitudinal axis C of the electron emitter filament 20.

Electrode 40 may include an aperture 42 formed therein. The center of the aperture 40 may lie in the plane that contains the base A of the V-shaped groove 13 and the longitudinal axis C of the electron emitter filament 20. The potential of the fourth electrode 40 may be greater than the potential of the second electrode (emitter filament) 20 and less than the potential of the third electrode (anode) 22. By way of example, the repeller 12 may be at about −106.5 volts, the filament 20 at about −100 volts, the electrode 40 at about −73 volts, and the anode 22 at about 0 volts.

Figure 4:
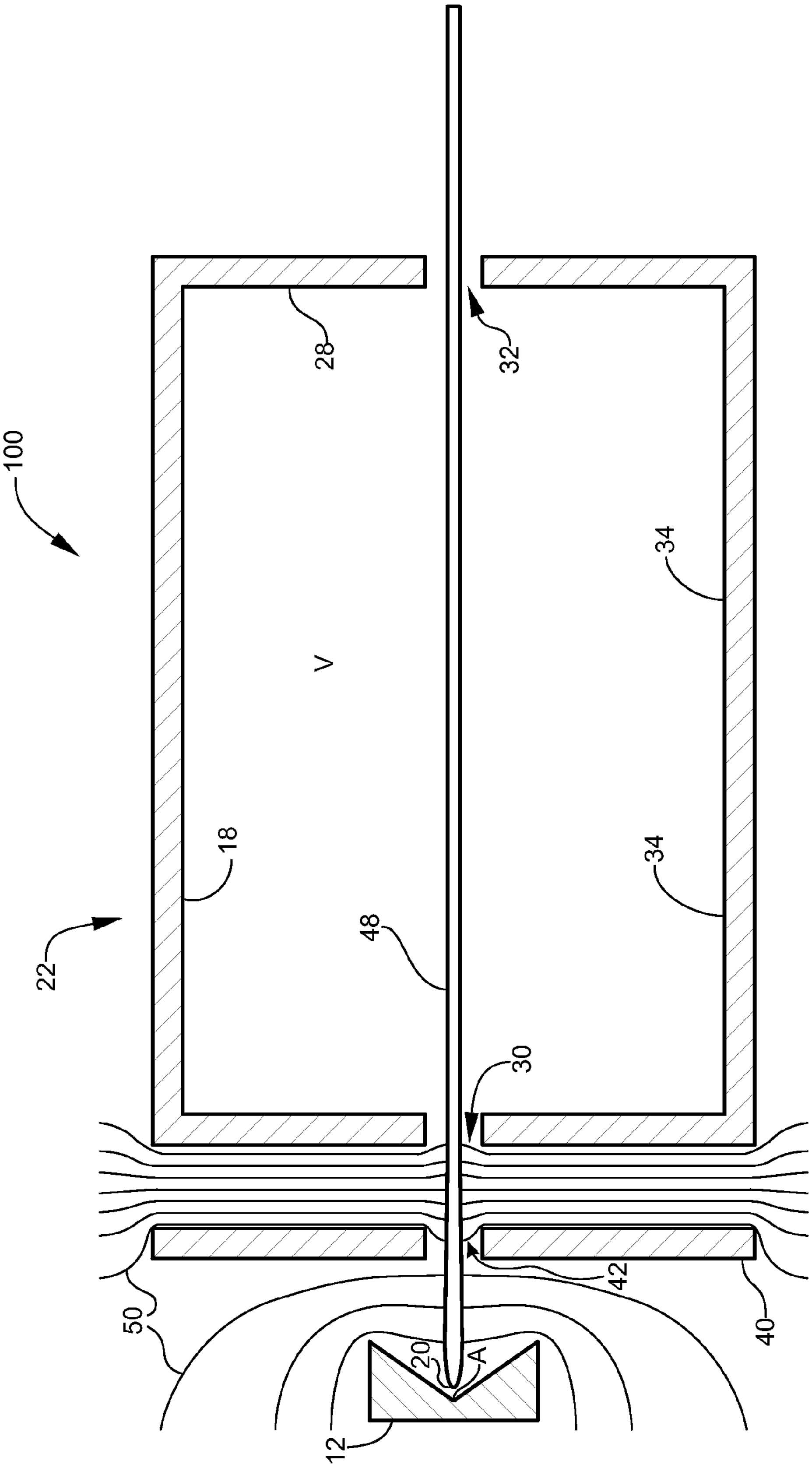
FIG. 4 is a schematic drawing of the ion source of FIG. 3, showing a simulated electron beam and lines of equal potential.

FIG. 4 is a schematic drawing of the ion source 100 of FIG. 3, showing a simulated electron beam 48 and lines of equal potential 50. The ion source 100 may produce a beam 48 having a very high degree of collimation. In the electron gun 100, the filament 20 may be less likely to receive high energy ion bombardment because the aperture 42 in electrode 40 may have a lower voltage than the aperture 30 of ion source 10. In FIG. 4, the optional planar surfaces 36, 38 are not shown.

The inventive ion source gun may obtain a very high degree of collimation using only four electrodes. Also, reasonable collimation may be achieved with three electrodes. As the distance of the filament 20 from the base A of the V-shaped groove 13 decreases, the electron beam may be more collimated.

To produce a symmetric, even electron beam, it may be important for the filament 20 to be parallel to the base A of the V-shaped groove 13. The filament 20 may be heated to high temperatures to produce electrons. As the temperature of the filament 20 rises, the filament 20 may expand and may sag. If so, then the filament 20 may not be parallel to the base A of the groove 13.

Figure 5:
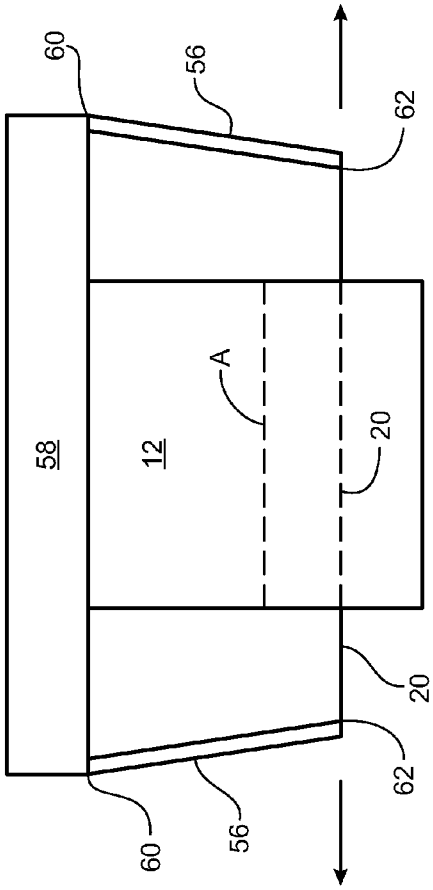
FIG. 5 is a schematic drawing of a top view of an embodiment of a support for an electron emitter filament.
Figure 6:
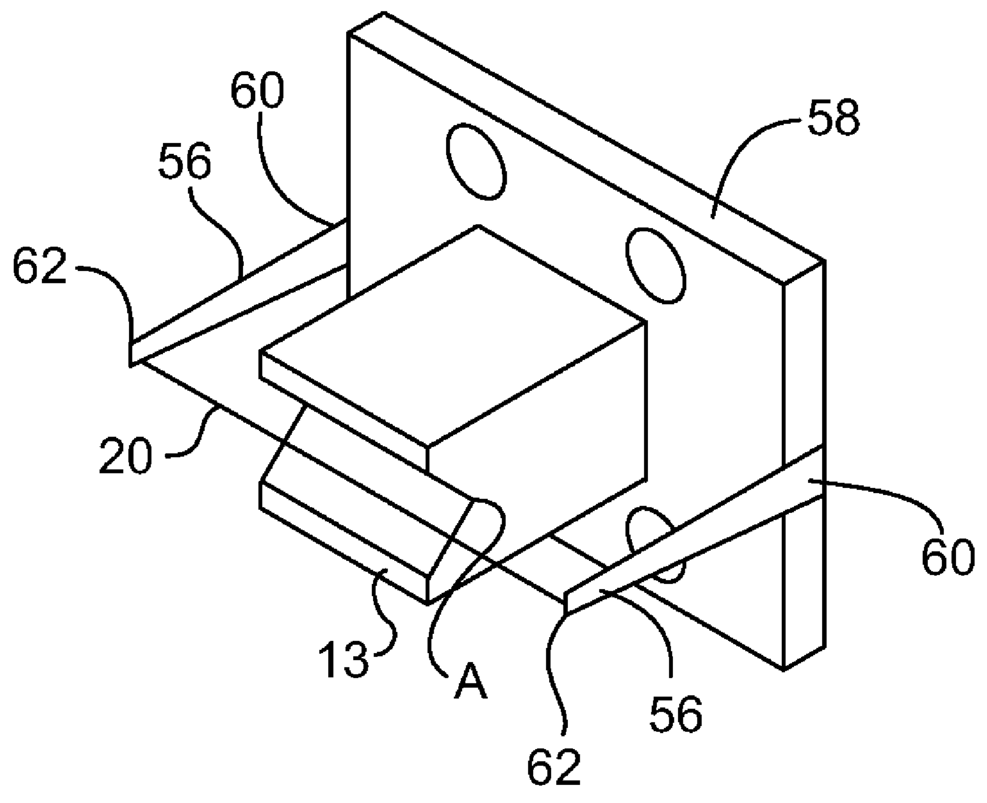
FIG. 6 is a perspective view of the support of FIG. 5

FIG. 5 is a schematic drawing of a top view of an embodiment of a repeller 12 and filament 20 showing a support for filament 20. FIG. 6 is a perspective view of the support shown in FIG. 5. A pair of support arms 56 may be fixed to a base 58 at their ends 60. The other ends 62 of arms 56 may support the filament 20. The support arms 56 may have an elastic or spring characteristic. The filament 20 is initially loaded in tension by the arms 56. As the filament 20 expands during heating, the arms 56 flex outward in the direction of the arrows in FIG. 5, thereby maintaining the tension in the filament 20 and also maintaining the filament 20 parallel to the base A of the V-shaped groove 13.

Figure 7:
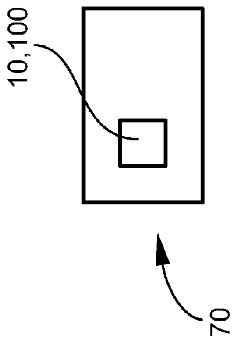
FIG. 7 is a schematic drawing of a charged particle spectrometer.

FIG. 7 is a schematic drawing of a charged particle spectrometer 70 that may include an ion source 10 or 100.

While the invention has been described with reference to certain preferred embodiments, numerous changes, alterations and modifications to the described embodiments are possible without departing from the spirit and scope of the invention as defined in the appended claims, and equivalents thereof.

What is claimed is:

1. An ion source, comprising:

a first electrode comprising a repeller having a V-shaped groove defined by a pair of planar surfaces symmetrically disposed at an angle to each other, the V-shaped groove including a base defined by a line of intersection of the pair of planar surfaces;

a second electrode comprising an electron emitter filament disposed adjacent the base of the V-shaped groove midway between the pair of planar surfaces and in the angle between the pair of planar surfaces, the electron emitter filament having a longitudinal axis that is substantially parallel to the base of the V-shaped groove; and a third electrode comprising an anode, the anode defining an enclosed volume having an aperture formed therein adjacent the electron emitter filament, wherein a center of the aperture lies in a plane that contains the base of the V-shaped groove and the longitudinal axis of the electron emitter filament;

wherein a potential of the first electrode is less than a potential of the second electrode and the potential of the second electrode less than a potential of the third electrode.

2. The ion source of claim 1, wherein the angle between the pair of planar surfaces is in a range of about 80 degrees to about 120 degrees.

3. The ion source of claim 1, further comprising a fourth electrode disposed between the electron emitter filament and the anode, the fourth electrode including an aperture formed therein, a center of the aperture lying in the plane that contains the base of the V-shaped groove and the longitudinal axis of the electron emitter filament, wherein a potential of the fourth electrode is greater than the potential of the second electrode and less than the potential of the third electrode.

4. The ion source of claim 3, wherein the fourth electrode lies in a plane that is normal to the plane that contains the base of the V-shaped groove and the longitudinal axis of the electron emitter filament.

5. The ion source of claim 1, wherein the anode includes a second aperture located further from the electron emitter filament than the aperture, the second aperture having a center that lies in the plane that contains the base of the V-shaped groove and the longitudinal axis of the electron emitter filament.

6. The ion source of claim 5, further comprising a collector disposed adjacent the second aperture and outside of the enclosed volume, for measuring energy of electrons passing through the second aperture.

7. The ion source of claim 5, wherein a surface of the anode that contains the second aperture lies in a plane that is perpendicular to the plane that contains the base of the V-shaped groove and the longitudinal axis of the electron emitter filament.

8. The ion source of claim 1, further comprising a base and a pair of support arms fixed to the base, wherein the electron emitter filament is supported by the pair of support arms.

9. The ion source of claim 8, wherein the electron emitter filament is loaded in tension by the support arms such that, as the electron emitter filament is heated and expands, the support arms elastically deform to maintain the electron emitter filament substantially parallel to the base of the V-shaped groove.

10. The ion source of claim 1, wherein a surface of the anode that contains the aperture lies in a plane that is perpendicular to the plane that contains the base of the V-shaped groove and the longitudinal axis of the electron emitter filament.

11. The ion source of claim 10, wherein the enclosed volume of the anode is symmetrical about the plane that contains the base of the V-shaped groove and the longitudinal axis of the electron emitter filament.

12. The ion source of claim 11, wherein surfaces of the anode that contain the aperture and the second aperture, respectively, lie in planes that are perpendicular to the plane that contains the base of the V-shaped groove and the longitudinal axis of the electron emitter filament.

13. The ion source of claim 12, wherein the anode is cylindrical in shape.

14. The ion source of claim 12, wherein the anode is rectangular in shape.

15. The ion source of claim 1, wherein the repeller includes respective planar surfaces that extend from each tip of the V-shaped groove and further wherein the respective planar surfaces lie in a plane that is normal to the plane that contains the base of the V-shaped groove and the longitudinal axis of the electron emitter filament.

16. The ion source of claim 1, wherein the anode includes an energy measurement portion that is electrically insulated from a remainder of the anode, the energy measurement portion being further from the electron emitter filament than the aperture and having a center that lies in the plane that contains the base of the V-shaped groove and the longitudinal axis of the electron emitter filament.

17. The ion source of claim 16, wherein the energy measurement portion lies in a plane that is normal to the plane that contains the base of the V-shaped groove and the longitudinal axis of the electron emitter filament.

18. A spectrometer comprising the ion source of claim 1.

19. The spectrometer of claim 18, wherein the spectrometer comprises a charged particle spectrometer.

20. The spectrometer of claim 19, wherein the ion source includes a fourth electrode disposed between the electron emitter filament and the anode, the fourth electrode including an aperture formed therein, a center of the aperture lying in the plane that contains the base of the V-shaped groove and the longitudinal axis of the electron emitter filament, wherein a potential of the fourth electrode is greater than the potential of the second electrode and less than the potential of the third electrode.

* * * * *